United States Patent [19]

Wilson et al.

[11] Patent Number: 5,990,014
[45] Date of Patent: Nov. 23, 1999

[54] IN SITU WAFER CLEANING PROCESS

[75] Inventors: Gregory M. Wilson, Chesterfield; Charles R. Lottes, Ballwin, both of Mo.

[73] Assignee: MEMC Electronic Materials, Inc., St. Peters, Mo.

[21] Appl. No.: 09/003,986

[22] Filed: Jan. 7, 1998

[51] Int. Cl.[6] .................................................. H01L 21/306
[52] U.S. Cl. ........................ 438/706; 438/906; 438/974
[58] Field of Search ..................... 438/477, 743, 438/774, 764, 906, 974, 706

[56] References Cited

U.S. PATENT DOCUMENTS

| | | | |
|---|---|---|---|
| 4,544,416 | 10/1985 | Meador et al. | 148/1.5 |
| 5,288,662 | 2/1994 | Lagendijk et al. | 438/774 |
| 5,352,636 | 10/1994 | Beinglass | 438/475 |
| 5,599,425 | 2/1997 | Lagendijk et al. | 438/743 |

OTHER PUBLICATIONS

Damon DeBusk et al., "Investigating a trans–dichloroethylene vapor cleaning process," *MICRO*, pp. 39–43, Sep. 1995.
Schumacher Brochure, Trans–LC™, Schumacher's "Ozone Friendly" TCA Replacement, Jan. 7, 1994, which includes Attachments C, D and E: A. K. Hochberg et al., "A New Liquid Chlorine Source for Silicon Oxidation," *J. Electrochem. Soc.*, vol. 139, No. 12, Dec. 1992; D. DeBusk et al., "Characterization of Trans 1,2 Dichloroethane as a substitute for 1,1,1–Trichloroethane in Silicon Oxidations;" and G. W. Dawson et al., "t–DCE, An Ozone Friendly TCA Alternative."

*Primary Examiner*—Robert Kunemund
*Assistant Examiner*—Donald L. Champagne
*Attorney, Agent, or Firm*—Senniger, Powers, Leavitt & Roedel

[57] ABSTRACT

A low pressure in situ wafer cleaning process and apparatus are disclosed wherein a low pressure external combustion reactor 2 in combination with a low pressure furnace 14 produces a stream of a combustion product through the combustion of a halogenated hydrocarbon and oxygen. The combustion product is contacted with semiconductor wafers in the low pressure furnace to remove Group I and II metals. After a sufficient time has passed for cleaning, the combustion reactor and furnace are purged with an inert gas to remove the combustion product. In a preferred embodiment, the halogenated hydrocarbon is trans-1,2-dichloroethylene and the combustion product is vaporous hydrochloric acid.

24 Claims, 2 Drawing Sheets

IN SITU WAFER CLEANING PROCESS

BACKGROUND OF THE INVENTION

The present invention relates to an in situ wafer cleaning process wherein group I and II metals such as sodium, potassium, calcium and magnesium are removed from the semiconductor wafer surface with a vaporous combustion product such as hydrochloric acid in a low pressure furnace during the wafer manufacturing process. The present invention also relates to an apparatus for cleaning semiconductor wafers utilizing a low pressure external combustion reactor for combusting a mixture of a halogenated hydrocarbon and oxygen to produce the stream of vaporous combustion product used to clean the semiconductor wafers.

It is well known and understood in the semiconductor industry that occupants in the cleanroom contribute "biological metals" into the cleanroom environment. These contaminants are generally group I and II metals such as sodium, potassium, calcium and magnesium. The presence of these metals in the cleanroom environment may lead to detectable levels of these metals on the surfaces of semiconductor wafers, and may cause decreased device performance in the wafer.

The detrimental effects of group I and II metals on device performance are well known in the art and result from interactions between the silicon lattice and the impurity. Sodium moves quickly through the silicon lattice at high temperatures and can cause undesired changes in bulk electrical properties. Potassium can also detrimentally effect bulk electrical properties and can further interfere and cause an inconsistent growth rate of gate oxides. Both calcium and magnesium have similar undesirable effects on silicon wafers.

The use of vaporous hydrochloric acid to remove group I and II metals as well as other impurities such as transition metals from the surfaces of semiconductor wafers is known in the art. Meador et. al. in U.S. Pat. No. 4,544,416 disclose a method for cleaning a silicon dioxide layer on a semiconductor wafer wherein the wafer is placed in a furnace tube having an atmosphere of steam or dry oxygen and held at a temperature of about 600° C. Thereafter vaporous hydrochloric acid is added to produce water and chlorine, and the chlorine getters ionic contaminants from the wafer surface.

However, the use of bottled pure hydrochloric acid gas inside a furnace or furnace tube has many disadvantages such as cost and difficulty in management and containment. Furthermore, vaporous hydrochloric acid in the presence of moisture can corrode equipment and lead to further contamination of the wafer with transition metals and a degradation in device performance.

Due to the disadvantages of bottled hydrochloric acid gas, alternative sources for the production of chlorine ions have been sought. DeBusk et. al. studied the use of trans-1,2-dichloroethylene (t-DCE) as a chlorine generating species to clean semiconductor wafers contaminated with iron. (DeBusk, Lagendijk and Porter, "Investigating a Trans-dichloroethylene Vapor Cleaning Process", MICRO, pp. 39–43, September, 1995). In an external torch system held at atmospheric pressure, bubbled t-DCE was carried into a mixing chamber by nitrogen and combusted with oxygen at around 900° C. to produce vaporous hydrochloric acid. The vaporous hydrochloric acid was subsequently injected into a furnace at atmospheric pressure and passed over a series of wafers. DeBusk et. al. determined that a t-DCE vapor cleaning process removed iron efficiently.

However, a need exists in the semiconductor industry for an in situ cleaning process which can be used during wafer processing at reduced pressures without introducing separate steps into the process. Currently, commercially available systems are incapable of tightly controlling the amounts of unreacted hydrocarbon and oxygen which may ultimately contact and contaminate the wafer as these systems require a large amount of a carrier gas to introduce the hydrocarbon into the system. Unreacted components become important, for example, when a polysilicon layer is deposited on a wafer in a LPCVD reactor subsequent to the wafer cleaning process. Unreacted oxygen can cause unwanted oxide layer formation on the wafer, while unreacted hydrocarbon on the wafer surface can result in the formation of non-uniform silicon grain size.

Furthermore, a need exists for a combustion reactor capable of producing combustion products at low pressures. Currently, combustion reactors utilized for burning liquid halogenated hydrocarbons with oxygen introduce the hydrocarbon by bubbling an inert gas such as nitrogen through the liquid hydrocarbon thus creating vapors containing nitrogen and the hydrocarbon. However, with a low pressure application, the amount of carrier gas required to create sufficient vaporous hydrocarbon is too much for the vacuum pumps to handle and maintain low pressures. Current reactors simply are not compatible with low pressure applications. Also, with commercially available reactors it has proven difficult, if not impossible, to tightly control the amount of hydrocarbon in the vapor phase with the carrier gas. This lack of control of the amount of vaporous hydrocarbon can lead to unacceptable levels of unreacted starting materials which may subsequently contact and contaminate the wafer surface.

SUMMARY OF THE INVENTION

Among the objects of the present invention, therefore, are the provision of an in situ semiconductor wafer cleaning process capable of cleaning wafers in a low pressure furnace; the provision of such a process which utilizes a vaporous combustion product produced from the low pressure combustion of a halogenated hydrocarbon and oxygen as the cleaning agent; the provision of such a process which virtually eliminates unwanted unreacted starting material; the provision of such a process that eliminates the need for carrier gas to introduce starting material into the system; the provision of such a process which is capable of producing an ultra-pure stream of vaporous combustion product; and the provision of a combustion reactor which can operate at low pressures.

Briefly, therefore, the present invention is directed to an in situ semiconductor wafer cleaning process wherein a set of semiconductor wafers is first placed in a low pressure furnace. In a low pressure external combustion reactor connected to the low pressure furnace, a continuous flow of a stoichiometric ratio of a vaporous halogenated hydrocarbon and oxygen are first thoroughly mixed and subsequently combusted at a temperature between about 850 and 1150° C. to produce a stream of vaporous combustion product. The pressure maintained within the low pressure furnace is between about 10 millitorr and about 3 Torr, and the pressure maintained within the external combustion chamber is between about 50 and 150 Torr. The stream of vaporous combustion product is injected into the low pressure furnace from the combustion reactor through a line and contacted with the wafers. The vaporous combustion product is contacted with the wafers for a time sufficient to remove Group I and Group II metals contaminants such as Na, K, Ca, and Mg from the wafer's surface and the combustion reactor and low pressure furnace are subsequently purged with an inert gas to remove the vaporous combustion product.

The invention is further directed to an apparatus for cleaning semiconductor wafers wherein a combustion reactor capable of maintaining a reduced pressure is in combination with a furnace maintained at a reduced pressure which produces a stream of combustion product that is subsequently introduced into the furnace and contacted with the wafers. The reactor and furnace are connected by a conduit which contains a flow restricting means capable of allowing a pressure differential to be maintained between the reactor and the furnace.

The invention is still further directed to an in situ wafer cleaning process wherein a mass flow ratio controller is utilized to maintain a constant ratio of oxygen and a halogenated hydrocarbon being combusted. A mass flow controller is set to a desired flow rate for oxygen, and the setting is sent to the mass flow ratio controller which determines the appropriate setting for the halogenated hydrocarbon mass flow controller. Once the proper settings have been made, the oxygen and halogenated hydrocarbon lines are opened and the vaporous starting materials flow into a combustion reactor where they are combusted to produce a vaporous combustion product. The pressure inside the combustion reactor is between about 50 and about 150 Torr. The combustion product is discharged into a furnace containing a semiconductor wafer. The pressure in the furnace is between about 10 millitorr and about 3 Torr. After the semiconductor wafers have been cleaned, the system is purged with a purging gas.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, a novel low pressure in situ wafer cleaning process and apparatus have been discovered. Advantageously, an external combustion reactor is coupled to a low pressure furnace, and the pressures maintained within both reduced, and the combustion reactor produce a vaporous stream of combustion product through combustion of a halogenated hydrocarbon and oxygen. This process also eliminates the need for a carrier gas to introduce the hydrocarbon into the combustion reactor and strictly controls the ratios of the hydrocarbon and oxygen introduced into the reactor to limit the amount of unreacted starting materials contacting the wafer during the cleaning process.

Figure 1:
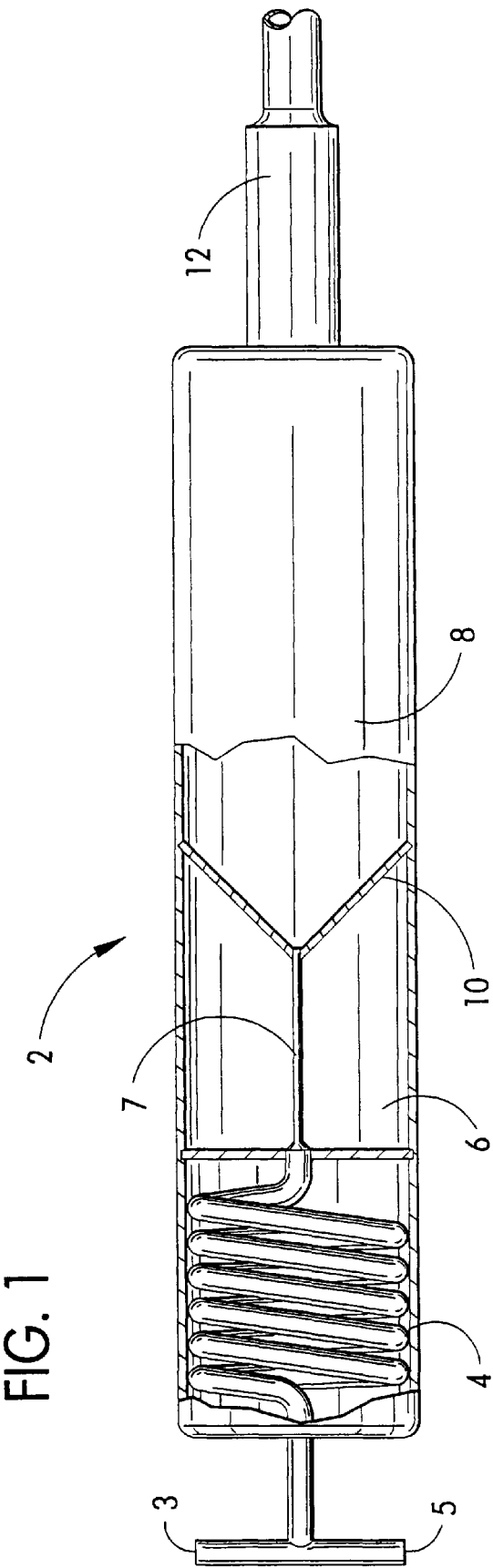
FIG. 1 is a schematic diagram of a combustion reactor.

Referring now to FIG. 1, an external combustion reactor 2 for use in the process of the present invention is shown. Combustion reactor 2 is capable of producing a vaporous combustion product such as vaporous hydrochloric acid or vaporous hydrofluoric acid. Combustion reactor 2 comprises a mixing section 4 wherein vaporous starting materials for the production of a combustion product enter through gas inlets 3 and 5 and are combined and thoroughly mixed prior to combustion. In FIG. 1, mixing section 4 is a coiled section of tubing sufficient in length to allow thorough mixing of the starting materials by means of diffusion. The coiled section may be formed from quartz, or any other suitable material non-reactive with the vaporous starting materials such as stainless steel, or any high-nickel containing alloy. Alternatively, mixing section 4 could be a chamber wherein the vaporous starting materials enter the mixing chamber on opposite sides and create a swirling flow of gases where mixing occurs through convection. Both diffusion and convection mixing can be used in the combustion reactor to thoroughly mix the vaporous starting materials prior to combustion.

Stoichiometric ratios of the starting materials are preferred so that the amounts of unreacted starting materials are minimized and combustion is nearly complete. If an excess of one starting material is necessary, it is preferred that oxygen be the excess starting material. When the desired combustion product is vaporous hydrochloric acid, a chlorinated hydrocarbon and oxygen are the starting materials. Chlorinated hydrocarbons are preferably trans-1,2-dichloroethylene or trichloroethane, with trans-1,2-dichloroethylene being most preferred. To determine the stoichiometric amounts of hydrocarbon and oxygen to be introduced into the mixing section, the number of equivalents must be determined. For example, if the hydrocarbon is the preferred trans-1,2,-dichloroethylene, the combustion reaction with oxygen is:

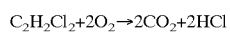

$$C_2H_2Cl_2 + 2O_2 \rightarrow 2CO_2 + 2HCl$$

Therefore, for every one equivalent of trans-1,2-dichloroethylene, two equivalents of oxygen are required to produce two equivalents of hydrochloric acid and two equivalents of carbon dioxide. Total flow rates of between about 30 and about 300 sccm into combustion reactor 2 have been found acceptable for use with the present invention, with a flow rate of 200 sccm oxygen and 100 sccm trans-1,2-dichloroethylene producing 200 sccm vaporous hydrochloric acid and 200 sccm carbon dioxide being most preferred.

Referring again to FIG. 1, the mixed vaporous starting materials exit mixing section 4 and enter gas acceleration section 6. Gas acceleration section 6 contains a capillary tube 7 or a similar device which is used to increase the velocity of the mixed vaporous starting materials exiting mixing section 4 to prevent backward flame propagation from combustion chamber 8 into mixing section 4 during combustion of the vaporous starting materials. The average velocity of the vaporous starting materials in capillary tube 7 is generally between about 900 and about 1400 m/s, with the average velocity being about 1200 m/s when the preferred flow rates of 200 sccm oxygen and 100 sccm trans-1,2,-dichloroethylene at a pressure of 100 Torr in the reactor are utilized.

Again referring to FIG. 1, the vaporous starting materials exit mixing section 6 and enter combustion chamber 8. Combustion chamber 8 may be formed from quartz, a ceramic material, silicon carbide, or other material non-reactive with combustion products such as hydrochloric acid or hydrofluoric acid. Combustion chamber 8 has a conical inlet 10 which allows for an even distribution of incoming vaporous starting materials throughout the combustion chamber to occur and eliminates the possibility of unwanted recirculation in the corners of combustion chamber 8. Such recirculation could be either uncombusted starting materials, combusted product, or a combination of both, and could lead to an inconsistent flow of combustion product exiting the combustion reactor or unstable combustion of the starting materials.

Combustion chamber 8 is held at a temperature which is sufficient to initiate spontaneous combustion of the vaporous starting materials. For example, when the preferred trans-1, 2-dichloroethylene is used with oxygen as the vaporous starting materials, combustion chamber 8 is held at a temperature of between about 850° C. and about 1150° C. to initiate spontaneous combustion. Generally, gas acceleration section 6 and combustion chamber 8 are enclosed within a furnace so as to achieve the necessary temperatures for combustion. Alternatively, gas acceleration section 6 and combustion chamber 8 could be heated with heating elements located around the circumference of the reactor to achieve the necessary temperature for combustion. After combustion, the combustion product exits the combustion chamber through exit line 12.

Figure 2:
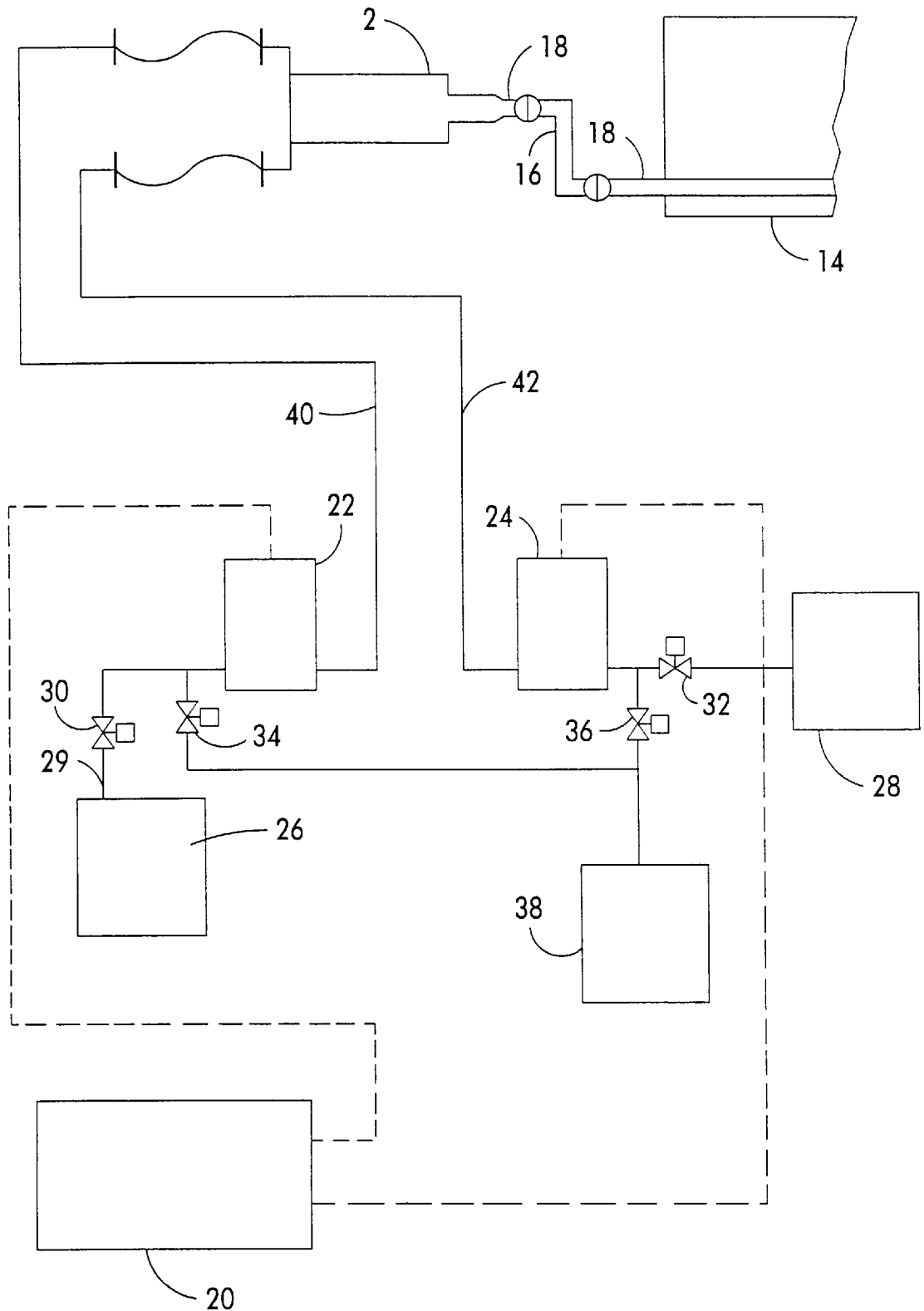
FIG. 2 is a schematic diagram of an apparatus for utilizing the process of the present invention.

Referring now to FIG. 2 the combustion reactor 2 is connected to low pressure furnace 14 via line 18. Low pressure furnace 14 is connected to a vacuum pump (not shown) to reduce the pressures in the low pressure furnace and the combustion reactor. The pressure maintained within low pressure furnace 14 is generally between about 10 millitorr and about 3 Torr. Low pressure furnace 14 may be, for example, a low pressure chemical vapor deposition furnace. The pressure maintained within combustion reactor 2 is generally between about 50 and about 150 Torr, with about 100 Torr being preferred. The pressure maintained within combustion reactor 2 is higher than the pressure maintained within low pressure furnace 14 in order to achieve nearly complete conversion of the starting materials into combustion product. This higher pressure allows for an increase in residence time in the combustion chamber for the mixed starting materials which allows for a more complete combustion reaction to occur as the starting materials are in the combustion chamber for a longer time period. If the pressure maintained in the combustion reactor was the same as the pressure maintained in the low pressure furnace, expansion of the starting materials at such a low pressure would be so great as to cause the starting materials to move through the combustion chamber at a rate which is too fast to ensure complete combustion. Therefore, the combustion product would contain a high level of unreacted starting materials that could have detrimental effects when contacted with the semiconductor wafers.

To maintain a pressure in combustion reactor 2 which is greater than the pressure maintained in low pressure furnace 14, flow restrictor 16 is placed in line 18 which connects combustion reactor 2 with low pressure furnace 14. Flow restrictor 16 has a diameter which is less than the diameter of line 18 and is capable of reducing the vacuum pull on combustion reactor 2 as compared to low pressure furnace 14 in order to achieve a higher pressure in combustion reactor 2 than in low pressure furnace 14. The diameter of the flow restrictor is dependent upon the pressure differential desired between low pressure furnace 14 and combustion reactor 2. Line 18 and flow restrictor 16 are both lined with quartz, a ceramic material, or other suitable material non-reactive with the combustion product.

Referring again to FIG. 2, there is shown a master mass flow controller ratio controller 20 electrically connected to the mass flow controller for the halogenated hydrocarbon 22 and mass flow controller for the oxygen 24. Mass flow controllers 22 and 24 are preferably electropolished stainless steel, and designed for ultraclean service. Such mass flow controllers and mass flow controller ratio controllers are commercially available from M.K.S. Instruments, Inc. (Andover, Mass.). Mass flow controller 22 controls the amount of halogenated hydrocarbon removed from halogenated hydrocarbon ampule 26 while mass flow controller 24 controls the amount of oxygen removed from oxygen source 28.

Mass flow controllers 22 and 24 are set up in a master-slave relationship in order to control the relative amounts of halogenated hydrocarbon and oxygen entering the mixing chamber of combustion reactor 2 through lines 40 and 42. The set-point on the slave mass controller 22 is continuously updated by mass flow controller ratio controller 20 based upon the actual mass flow measured by master flow controller 24. This masterslave relationship allows the ratio of vaporous starting materials to be tightly controlled to ensure almost complete combustion of the vaporous starting materials, and minimize the amount of unreacted material.

Once mass flow controller 24 has been properly set, this setting is electronically sent to mass flow ratio controller 20 which determines and electronically sends the setting point to mass flow controller 22. When hydrochloric acid gas is the desired combustion product and the preferred halogenated hydrocarbon trans-1,2-dichloroethylene is used, and the set point for mass flow controller 24 is 200 sccm oxygen for example, ratio controller 20 would electronically adjust the set point for mass flow controller 22 at 100 sccm of trans-1,2-dichloroethylene. Such setting would produce 200 sccm of vaporous hydrochloric acid and 200 sccm carbon dioxide based on the reaction equation previously set forth. Ratio controller 20 ensures that a stoichiometric ratio of starting components is maintained to minimize unreacted starting materials.

After the mass flow controllers have been electronically set, valves 30 and 32 open to allow gas to escape ampule 26 and oxygen source 28. Valves 30 and 32 are preferably electropolished stainless steel, and are designed for ultraclean service. Valves 30 and 32 may be pneumatically actuated valves such as those commercially available from Swagelok Company (Solon, Ohio). Ampule 26 is a teflon lined stainless steel ampule commercially available from Advanced Delivery and Chemical Systems, Inc. (Burnet Tex.). When the halogenated hydrocarbon is the preferred trans-1,2-dichloroethylene, ampule 26 contains trans-1,2-dichloroethylene, which is a liquid at room temperature and atmospheric pressure. However, upon the opening of valve 30, the ampule realizes a pressure drop to correspond with the pressure in combustion reactor 2, with which ampule 26 is in combination.

As previously stated, the pressure maintained within combustion reactor 2 is generally between about 50 and about 150 Torr, and when ampule 26 realizes a pressure drop to this reduced pressure, the trans-1,2-dichloroethylene immediately begins to boil and release vaporous trans-1,2-dichloroethylene into line 29, through valve 30 and mass flow controller 22, into line 40 and finally into combustion reactor 2. Because the halogenated hydrocarbon is vaporous and is not being carried by an inert gas, the amount released for combustion from ampule 26 can be closely controlled by mass flow controller 22 to ensure a stoichiometric ratio is maintained with the oxygen from oxygen source 28. With the present invention, there is no need for a carrier gas such as nitrogen to carry the halogenated hydrocarbon into the mixing section of the combustion reactor. This elimination of carrier gas allows the combustion reactor to be in combination with a low pressure furnace without the loss of vacuum due a large amount of carrier gas.

A stoichiometric ratio of halogenated hydrocarbon and oxygen should be maintained to maximize the combustion reaction between the hydrocarbon and oxygen and minimize the amount of unreacted starting materials exiting the combustion reactor. As previously stated, unreacted starting materials entering the low pressure furnace can have detrimental effects upon the wafers. The combustion product produced in the combustion reactor of the present invention has been shown to contain less than 0.1% (by volume) unreacted oxygen and less than 0.001% (by volume) unreacted hydrocarbon when the flow rates are 200 sccm oxygen and 100 sccm trans-1,2-dichloroethylene.

Referring again to FIG. 2, after valves 30 and 32 have been opened, the two gas streams enter the mixing section of combustion reactor 2 and mixing begins. The gases are mixed and combusted in combustion reactor 2 as described above and produce a stream of combustion product that exits combustion reactor 2 through line 18. When the halogenated hydrocarbon is the preferred trans-1,2-dichloroethylene, the combustion product is vaporous hydrochloric acid. This hydrochloric acid enters low pressure furnace 14 and is contacted with semiconductor wafers in the low pressure furnace. The combustion product is contacted with the wafers for a period of time sufficient to clean group I and II metals, such as sodium, potassium, calcium, and magnesium, from the surface of the semiconductor wafers, generally on the order of about 5 minutes at a flow rate of 200 sccm of vaporous hydrochloric acid. After cleaning, the semiconductor wafers generally have only between about $5 \times 10^9$ and about $5 \times 10^{10}$ atoms/cm$^2$ of sodium, potassium, calcium, and magnesium on their surface.

After the wafers have been sufficiently cleaned, valves 30 and 32 are closed to stop the flow of the halogenated hydrocarbon and oxygen into the combustion reactor, and hence the flow of combustion product into low pressure furnace 14. When the flow of halogenated hydrocarbon has reached zero, valves 34 and 36 open to allow nitrogen from nitrogen source 38 to pass through mass flow controllers 22 and 24. Mass flow controllers 22 and 24, lines 40 and 42, as well as combustion reactor 2 and low pressure furnace 14 are purged with nitrogen and evacuated until the vacuum system exhaust is free of the combustion product. Once the purging with nitrogen is complete, the next treatment of the semiconductor wafers in the low pressure furnace may begin.

In a preferred embodiment, after the in situ wafer cleaning process described above is complete and the mass flow controllers, combustion reactor, and low pressure furnace have been purged with nitrogen, a low pressure chemical vapor deposition cycle is begun wherein a layer of polysilicon, such as an enhanced gettering layer, is deposited on the surfaces of the wafers just cleaned. Because the wafers have been sufficiently cleaned, a polysilicon layer can be deposited upon the wafer surface with only a minimal amount of Group I or II metals being trapped between the silicon wafer and the deposited polysilicon layer. Also, because the cleaning process of the present invention minimizes the amounts of unreacted starting materials which contact the wafer, there is very minimal, if any, oxide growth on the wafer or hydrocarbon attached to the wafer surface.

In view of the above, it will be seen that the several objects of the invention are achieved.

As various changes could be made in the above-described in situ wafer cleaning process and apparatus without departing from the scope of the invention, it is intended that all matter contained in the above description be interpreted as illustrative and not in a limiting sense.

What is claimed is:

1. An in situ semiconductor wafer cleaning process, the process comprising flowing oxygen and a vaporous halogenated hydrocarbon into a combustion reactor and reacting them to produce a vaporous combustion product, the pressure in the combustion reactor being between about 50 and about 150 Torr and the temperature in the combustion reactor being such that the halogenated hydrocarbon and oxygen spontaneously combust;

discharging the vaporous combustion product from the combustion reactor and introducing it into a low pressure furnace which contains a semiconductor wafer, the pressure in the furnace being between about 10 millitorr and about 3 Torr;

contacting the semiconductor wafer with the vaporous combustion product; and purging the combustion reactor and low pressure furnace with a gas to remove the vaporous combustion product.

2. A process as set forth in claim 1 wherein the vaporous halogenated hydrocarbon is produced by reducing the pressure in a vessel containing liquid halogenated hydrocarbon.

3. A process as set forth in claim 1 wherein the halogenated hydrocarbon is trans-1,2-dichloroethylene and the combustion product is vaporous hydrochloric acid.

4. A process as set forth in claim 1 wherein the halogenated hydrocarbon is trichloroethane and the combustion product is vaporous hydrochloric acid.

5. A process as set forth in claim 1 wherein the wafer is subjected to a low pressure chemical vapor deposition in the low pressure furnace to grow a polysilicon layer on the wafer after the combustion reactor and low pressure furnace are purged.

6. A process as set forth in claim 1 wherein the vaporous combustion product is injected into the low pressure furnace at a flow rate of between about 150 to about 300 sccm for a period of about 5 minutes.

7. A process as set forth in claim 1 wherein the purging gas is selected from the group consisting of argon and nitrogen.

8. A process as set forth in claim 1 wherein the total flow rate of halogenated hydrocarbon and oxygen into the combustion reactor is between about 30 and about 300 sccm.

9. A process as set forth in claim 1 wherein the halogenated hydrocarbon is trans-1,2-dichloroethylene, the trans-1,2-dichloroethylene having a flow rate into the combustion reactor of about 100 sccm and the oxygen having a flow rate into the combustion reactor of about 200 sccm.

10. A process as set forth in claim 1 wherein the halogenated hydrocarbon is trans-1,2-dichloroethylene, the trans-1,2-dichloroethylene having a flow rate into the combustion reactor of about 100 sccm and the oxygen having a flow rate into the combustion reactor of about 200 sccm, the pressure in the combustion reactor being maintained at about 100 Torr and the temperature in the combustion reactor being about 950° C.

11. A process as set forth in claim 1 wherein the resulting semiconductor wafer has a concentration at the surface of between about $5 \times 10^9$ and about $5 \times 10^{10}$ atoms/cm$^2$ of sodium, potassium, calcium, and magnesium.

12. A process as set forth in claim 2 wherein the amount of unreacted trans-1,2-dichloroethylene is about 0.0001% by volume and the amount of unreacted oxygen is about 0.1% by volume.

13. A process as set forth in claim 2 wherein the halogenated hydrocarbon is trans-1,2-dichloroethylene, the trans-1,2-dichloroethylene having a flow rate of 100 sccm into the combustion reactor and the oxygen having a flow rate of 200 sccm into the combustion reactor.

14. An in situ semiconductor wafer cleaning process, the process comprising configuring a mass flow ratio controller to a desired ratio of oxygen and a halogenated hydrocarbon;

setting an oxygen mass flow controller to a desired flow rate of oxygen;

sending the setting of the oxygen mass flow controller to the mass flow ratio controller;

adjusting a halogenated hydrocarbon mass flow controller to a flow rate of halogenated hydrocarbon;

opening simultaneously an oxygen line and a halogenated hydrocarbon line so that oxygen flows through the oxygen mass flow controller and halogenated hydrocarbon flows through the halogenated hydrocarbon mass flow controller;

introducing oxygen and halogenated hydrocarbon into a combustion reactor and combusting the oxygen and halogenated hydrocarbon to produce a combustion product, the pressure inside the combustion reactor being between about 50 and about 150 Torr;

discharging the combustion product into a furnace containing a semiconductor wafer, the pressure in the furnace being between about 10 millitorr and about 3 Torr; and purging the oxygen mass flow controller, halogenated hydrocarbon mass flow controller, combustion reactor and furnace with a purging gas.

15. An in situ semiconductor wafer cleaning process, the process comprising:

reducing the pressure in a vessel containing trans-1,2-dichloroethylene to produce vaporous trans-1,2-dichloroethylene;

flowing oxygen and the trans-1,2-dichloroethylene into a combustion reactor and reacting them to produce a vaporous combustion product, the pressure in the combustion reactor being between about 50 and about 150 Torr, the temperature in the combustion reactor being such that the trans-1,2-dichloroethylene and oxygen spontaneously combust;

transferring the vaporous combustion product from the combustion reactor to a low pressure furnace which contains a semiconductor wafer, the pressure in the furnace being between about 10 millitorr and about 3 Torr;

contacting the semiconductor wafer with the vaporous combustion product; and purging the combustion reactor and low pressure furnace with a gas to remove the vaporous combustion product.

16. A process as set forth in claim 15 wherein the wafer is subjected to a low pressure chemical vapor deposition in the low pressure furnace to grow a polysilicon layer on the wafer after the combustion reactor and low pressure furnace are purged.

17. A process as set forth in claim 15 wherein the vaporous combustion product is injected into the low pressure furnace at a flow rate of between about 150 to about 300 sccm for a period of about 5 minutes.

18. A process as set forth in claim 15 wherein the purging gas is selected from the group consisting of argon and nitrogen.

19. A process as set forth in claim 15 wherein the total flow rate of trans-1,2-dichloroethylene and oxygen into the combustion chamber is between about 30 and about 300 sccm.

20. An in situ semiconductor wafer cleaning process, the process comprising:

reducing the pressure in a vessel containing trichloroethane to produce vaporous trichloroethane;

flowing oxygen and the trichloroethane into a combustion reactor and reacting them to produce a vaporous combustion product, the pressure in the combustion reactor being between about 50 and about 150 Torr, the temperature in the combustion reactor being such that the trichloroethane and oxygen spontaneously combust;

transferring the vaporous combustion product from the combustion reactor to a low pressure furnace which contains a semiconductor wafer, the pressure in the furnace being between about 10 millitorr and about 3 Torr;

contacting the semiconductor wafer with the vaporous combustion product; and purging the combustion reactor and low pressure furnace with a gas to remove the vaporous combustion product.

21. A process as set forth in claim 20 wherein the wafer is subjected to a low pressure chemical vapor deposition in the low pressure furnace to grow a polysilicon layer on the wafer after the combustion reactor and low pressure furnace are purged.

22. A process as set forth in claim 20 wherein the vaporous combustion product is injected into the low pressure furnace at a flow rate of between about 150 to about 300 sccm for a period of about 5 minutes.

23. A process as set forth in claim 20 wherein the purging gas is selected from the group consisting of argon and nitrogen.

24. A process as set forth in claim 20 wherein the total flow rate of trichloroethane and oxygen into the combustion chamber is between about 30 and about 300 sccm.

* * * * *